(12) United States Patent
Doris et al.

(10) Patent No.: US 10,734,504 B2
(45) Date of Patent: *Aug. 4, 2020

(54) INTEGRATION OF STRAINED SILICON GERMANIUM PFET DEVICE AND SILICON NFET DEVICE FOR FINFET STRUCTURES

(71) Applicants: INTERNATIONAL BUSINESS MACHINES CORPORATION, Armonk, NY (US); STMicroelectronics, Inc., Coppell, TX (US)

(72) Inventors: Bruce B. Doris, Slingerlands, NY (US); Hong He, Schenectady, NY (US); Nicolas J. Loubet, Guilderland, NY (US); Junli Wang, Slingerlands, NY (US)

(73) Assignees: INTERNATIONAL BUSINESS MACHINES CORPORATION, Armonk, NY (US); STMICROELECTRONICS, INC, Coppell, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/020,475

(22) Filed: Jun. 27, 2018

(65) Prior Publication Data
US 2018/0323278 A1    Nov. 8, 2018

Related U.S. Application Data

(60) Continuation of application No. 14/953,574, filed on Nov. 30, 2015, now Pat. No. 10,446,670, which is a
(Continued)

(51) Int. Cl.
*H01L 21/336* (2006.01)
*H01L 29/66* (2006.01)
(Continued)

(52) U.S. Cl.
CPC .... *H01L 29/6681* (2013.01); *H01L 21/26506* (2013.01); *H01L 21/823807* (2013.01);
(Continued)

(58) Field of Classification Search
None
See application file for complete search history.

(56) References Cited

U.S. PATENT DOCUMENTS 7,619,239 B2   11/2009   Irisavva et al.
7,964,865 B2    6/2011   Chidambarrao et al.
(Continued)

FOREIGN PATENT DOCUMENTS

CN            103311125 A      9/2013

*Primary Examiner* — Hung K Vu
(74) *Attorney, Agent, or Firm* — Cantor Colburn LLP; Vazken Alexanian

(57) ABSTRACT

A method of forming a finFET transistor device includes forming a crystalline, compressive strained silicon germanium (cSiGe) layer over a substrate; masking a first region of the cSiGe layer so as to expose a second region of the cSiGe layer; subjecting the exposed second region of the cSiGe layer to an implant process so as to amorphize a bottom portion thereof and transform the cSiGe layer in the second region to a relaxed SiGe (rSiGe) layer; performing an annealing process so as to recrystallize the rSiGe layer; epitaxially growing a tensile strained silicon layer on the rSiGe layer; and patterning fin structures in the tensile strained silicon layer and in the first region of the cSiGe layer.

12 Claims, 8 Drawing Sheets

Related U.S. Application Data division of application No. 14/607,256, filed on Jan. 28, 2015, now Pat. No. 9,761,699.

(51) Int. Cl.

| | | |
|---|---|---|
| *H01L 29/78* | (2006.01) | |
| *H01L 21/265* | (2006.01) | |
| *H01L 21/8238* | (2006.01) | |
| *H01L 27/092* | (2006.01) | |
| *H01L 29/10* | (2006.01) | |
| *H01L 29/165* | (2006.01) | |
| *H01L 29/423* | (2006.01) | |

(52) U.S. Cl.
CPC .. *H01L 21/823821* (2013.01); *H01L 27/0924* (2013.01); *H01L 29/1054* (2013.01); *H01L 29/165* (2013.01); *H01L 29/42356* (2013.01); *H01L 29/785* (2013.01); *H01L 29/7847* (2013.01); *H01L 29/7848* (2013.01); *H01L 29/7849* (2013.01); *H01L 29/66545* (2013.01)

(56) References Cited

U.S. PATENT DOCUMENTS

| | | |
|---|---|---|
| 8,008,751 B2 | 8/2011 | Irisawa et al. |
| 8,138,543 B2 | 3/2012 | Cheng et al. |
| 8,183,627 B2 | 5/2012 | Currie |
| 8,486,776 B2 | 7/2013 | Bedell et al. |
| 8,937,299 B2 | 1/2015 | Basu et al. |
| 9,515,185 B2 | 12/2016 | Liu et al. |
| 9,520,393 B2 | 12/2016 | Loubet et al. |
| 9,761,699 B2 | 9/2017 | Doris et al. |
| 10,446,670 B2 * | 10/2019 | Doris ................ H01L 29/42356 |
| 2002/0168864 A1 | 11/2002 | Cheng |
| 2004/0178406 A1 | 9/2004 | Chu |
| 2005/0145941 A1 | 7/2005 | Bedell et al. |
| 2008/0135886 A1 * | 6/2008 | Irisawa ................ H01L 21/84 |
| | | 257/255 |
| 2009/0173967 A1 | 7/2009 | Hamaguchi |
| 2011/0210393 A1 | 9/2011 | Chen et al. |
| 2011/0278676 A1 | 11/2011 | Cheng et al. |
| 2011/0309333 A1 | 12/2011 | Cheng |
| 2012/0091528 A1 | 4/2012 | Chang et al. |
| 2012/0161238 A1 | 6/2012 | Scheiper et al. |
| 2012/0190216 A1 | 7/2012 | Chan et al. |
| 2013/0200433 A1 | 8/2013 | Adam |
| 2013/0337637 A1 * | 12/2013 | Cheng ............. H01L 21/823807 |
| | | 438/478 |
| 2014/0151766 A1 | 6/2014 | Eneman et al. |
| 2016/0163814 A1 | 6/2016 | Ando et al. |
| 2016/0204229 A1 | 7/2016 | Tsai et al. |
| 2016/0218192 A1 | 7/2016 | Doris et al. |
| 2016/0218215 A1 | 7/2016 | Doris et al. |
| 2017/0365685 A1 | 12/2017 | Doris |

* cited by examiner

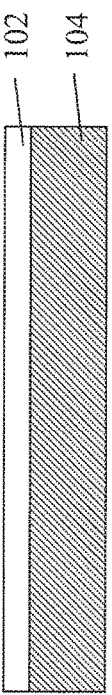
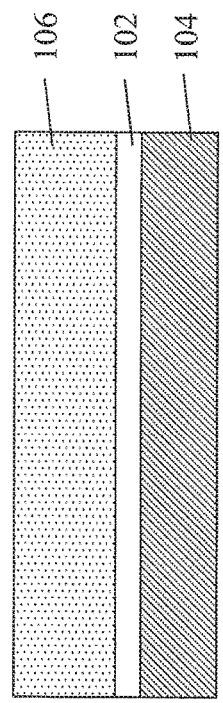
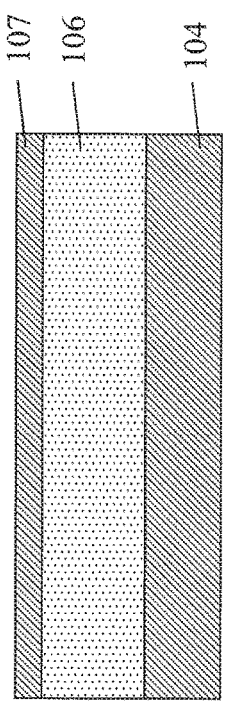
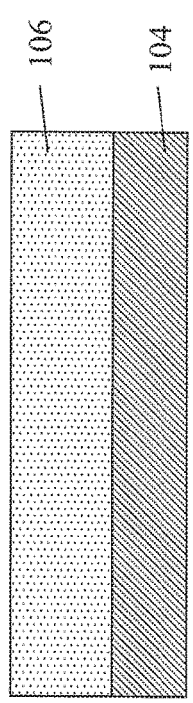
Figure 1
Figure 2
Figure 3
Figure 4

INTEGRATION OF STRAINED SILICON GERMANIUM PFET DEVICE AND SILICON NFET DEVICE FOR FINFET STRUCTURES

DOMESTIC PRIORITY

This application is a continuation of U.S. patent application Ser. No. 14/953,574, filed on Nov. 30, 2015, which is a divisional of U.S. application Ser. No. 14/607,256, filed Jan. 28, 2015, now U.S. Pat. No. 9,761,699, issued Sep. 12, 2017, the contents of which are incorporated by reference.

BACKGROUND

The present invention relates generally to semiconductor device manufacturing and, more particularly, to integrating strained silicon germanium (SiGe) and strained silicon (Si) fins in finFET structures.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques.

For example, when the gate length of conventional planar metal oxide semiconductor field effect transistors (MOSFETs) is scaled below 100 nm, problems associated with short channel effects (e.g., excessive leakage between the source and drain regions) become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent one type of structure that has been considered as a candidate for succeeding existing planar MOSFETs. In double-gate MOSFETs, two gates may be used to control short channel effects. A finFET is a double-gate structure that exhibits good short channel behavior, and includes a channel formed in a vertical fin. The finFET structure may be fabricated using layout and process techniques similar to those used for conventional planar MOSFETs.

SUMMARY

In one aspect, a method of forming a finFET transistor device includes forming a crystalline, compressive strained silicon germanium (cSiGe) layer over a substrate; masking a first region of the cSiGe layer so as to expose a second region of the cSiGe layer; subjecting the exposed second region of the cSiGe layer to an implant process so as to amorphize a bottom portion thereof and transform the cSiGe layer in the second region to a relaxed SiGe (rSiGe) layer; performing an annealing process so as to recrystallize the rSiGe layer; epitaxially growing a tensile strained silicon layer on the rSiGe layer; and patterning fin structures in the tensile strained silicon layer and in the first region of the cSiGe layer.

In another aspect, a method of forming a finFET transistor device includes thinning a silicon-on-insulator (SOI) layer formed over a buried oxide (BOX) layer; epitaxially growing a crystalline, compressive strained silicon germanium (cSiGe) layer on the thinned SOI layer; performing a thermal process so as to drive germanium from the cSiGe layer into the thinned SOI layer; masking a first region of the cSiGe layer so as to expose a second region of the cSiGe layer; subjecting the exposed second region of the cSiGe layer to an implant process so as to amorphize a bottom portion thereof and transform the cSiGe layer in the second region to a relaxed SiGe (rSiGe) layer; performing an annealing process so as to recrystallize the rSiGe layer; epitaxially growing a tensile strained silicon layer on the rSiGe layer; and patterning fin structures in the tensile strained silicon layer and in the first region of the cSiGe layer.

In still another aspect, a finFET transistor device includes a substrate; a first plurality of fin structures formed over the substrate, the first plurality of fin structures comprising a compressive strained, silicon germanium SiGe material; and a second plurality of fin structures formed over the substrate, the second plurality of fin structures comprising a tensile strained, silicon material.

BRIEF DESCRIPTION OF THE DRAWINGS

Referring to the exemplary drawings wherein like elements are numbered alike in the several Figures:

FIGS. 1 through 15, 17 and 18 are a series of cross sectional views and FIG. 16 is a top view an exemplary embodiment of a method of forming finFET transistor devices, in accordance with an exemplary embodiment, in which:

FIG. 1 illustrates a starting semiconductor structure including a thinned silicon-on-insulator layer formed on a buried oxide (BOX) layer;

FIG. 2 illustrates the formation of an epitaxially grown, crystalline SiGe layer on the structure of FIG. 1;

FIG. 3 illustrates a thermal process to drive germanium from the SiGe layer into the silicon of the SOI layer;

FIG. 4 illustrates removal of the oxide layer from the structure in FIG. 3;

FIG. 5 illustrates lithographic patterning of the structure in FIG. 4 to expose an "n" region of the device while protecting a "p" region of the device;

FIG. 6 illustrates an implant process that subjects the exposed portions of the compressive strained SiGe layer in the "n" region an implant species that amorphizes a bottom portion of the SiGe layer;

FIG. 7 illustrates the removal of resist layer portion of a block mask and a recrystallization anneal that fully crystallizes the relaxed SiGe layer in the "n" region;

FIG. 8 illustrates recessing of the crystallized relaxed SiGe layer in preparation for use as a seed layer for further epitaxial growth;

FIG. 9 illustrates an epitaxial silicon growth process to form a tensile strained silicon layer in the "n" region;

FIG. 10 illustrates removal of the remaining hardmask layer over the "p" region;

FIG. 11 illustrates the patterning of a set of compressive strained SiGe fins, and a set of tensile strained Si fins from the structure of FIG. 10;

FIG. 12 illustrates the formation of a dummy gate stack including a dummy gate oxide layer and a dummy amorphous or polysilicon gate layer over the dummy gate oxide layer;

FIG. 13 illustrates removal of the dummy gate layer from the structure of FIG. 12;

FIG. 14 illustrates masking to block the "p" region and expose a portion of the "n" region in order to remove the dummy gate oxide layer from the exposed portion of the "n" region;

FIG. 15 illustrates removal of the mask;

FIG. 16 is a top view that illustrates an etch process to remove portions of the relaxed SiGe layer beneath the tensile strained Si NFET fins;

FIG. 17 is a cross sectional view along the arrows in FIG. 16; and

FIG. 18 illustrates the removal of the remaining dummy gate oxide layer from the "p" region, and the formation of final high-k and gate stack layers.

DETAILED DESCRIPTION

Figure 5:
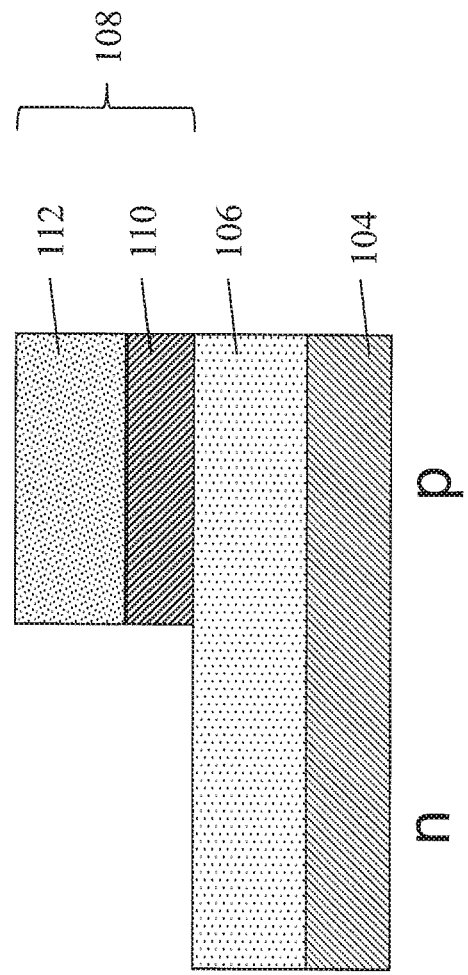

For both planar FET and finFET devices, the transistor gain is proportional to the mobility ($\mu$) of the majority carrier in the transistor channel. The current carrying capability, and hence the performance of a MOS transistor is proportional to the mobility of the majority carrier in the channel. The mobility of holes, which are the majority carriers in a P-channel field effect transistor (PFET), and the mobility of electrons, which are the majority carriers in an N-channel field effect transistor (NFET), may be enhanced by applying an appropriate stress to the channel. Existing stress engineering methods greatly enhance circuit performance by increasing device drive current without increasing device size and device capacitance. For example, a tensile stress liner applied to a planar NFET transistor induces a longitudinal stress in the channel and enhances the electron mobility, while a compressive stress liner applied to a planar PFET transistor induces a compressive stress in the channel and enhances the hole mobility.

Next generation CMOS technologies, for example finFET (or tri-gate) 3D transistor structures, continue to rely on increased channel mobility to improve the device performance. Accordingly, embodiments herein provide a new integration method to form finFET transistor devices with increased channel mobility. In one exemplary embodiment, an integration method and resulting device provides a tensile strained silicon (Si) NFET and a compressive strained channel silicon germanium (SiGe) PFET incorporating a finFET or tri gate structure.

Referring generally now to FIGS. 1 through 19, there is shown a series of cross sectional views and a top view (FIG. 16) of a method of forming finFET transistor devices, in accordance with an exemplary embodiment. As shown in FIG. 1, a starting semiconductor structure 100 includes a semiconductor-on-insulator layer, or more specifically a silicon-on-insulator (SOI) layer 102 formed on a buried insulator layer, or more specifically a buried oxide (BOX) layer 104. Although not specifically illustrated in FIG. 1, one skilled in the art will appreciate that the BOX layer is formed on a bulk semiconductor substrate such as, for example, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The SOI layer 102 shown in FIG. 1 is used as a seeding layer for a subsequent epitaxial SiGe growth process. As such, the SOI layer 102 is initially prepared for such seeding by thinning the SOI layer 102 down to an appropriate thickness of, for example, about 10 nanometers (nm) or less, and more specifically to a thickness of 5 nm or less. FIG. 2 illustrates the formation of the epitaxially grown, crystalline SiGe layer 106, having a thickness of about 35 nm or more. The thickness of the SiGe layer 106 is dependent on Ge concentration. As an example, if the Ge concentration is 20-25%, the SiGe layer thickness is less than 50 nm. The lower the Ge concentration, the thicker SiGe layer can be grown, and vice versa. Then, as shown in FIG. 3, a thermal oxidation or thermal diffusion process is performed in order to drive germanium from the SiGe layer 106 into the silicon of the SOI seed layer 102. As a result, the SiGe layer 106 effectively extends to the top of the BOX layer 104, and an oxide layer 107 atop the SiGe layer 106 may be formed. However, the oxide layer 107 may then be removed as shown in FIG. 4 by a suitable process, such as a dilute hydrogen fluoride (DHF) and water etch for example. The SiGe layer 106 atop the BOX layer 104 is fully (compressive) strained at this point in the processing, and is hereafter referred to as a compressive SiGe (cSiGe) layer 106.

Referring now to FIG. 5, the resulting structure is lithographically patterned with a blocking mask 108 that may include a nitride (e.g., SiN) or an oxide hardmask layer 110, and a photoresist layer 112. The mask 108 is patterned in a manner to expose an "n" region of the device (i.e., where NFET devices are to be formed) while protecting a "p" region of the device (i.e., where PFET devices are to be formed). As then shown in FIG. 6, the exposed portions of the cSiGe layer 106 in the "n" region are subjected to an implant species (indicated by the arrows) that amorphizes a bottom portion 114 of the cSiGe layer 106 in the "n" region. This amorphization of the bottom portion 114 has the effect of relaxing the cSiGe layer 106 in the "n" region; thus, the now relaxed portion of the cSiGe layer 106 is hereafter designated as a relaxed SiGe (rSiGe) layer 106' in the figures.

Figure 6:
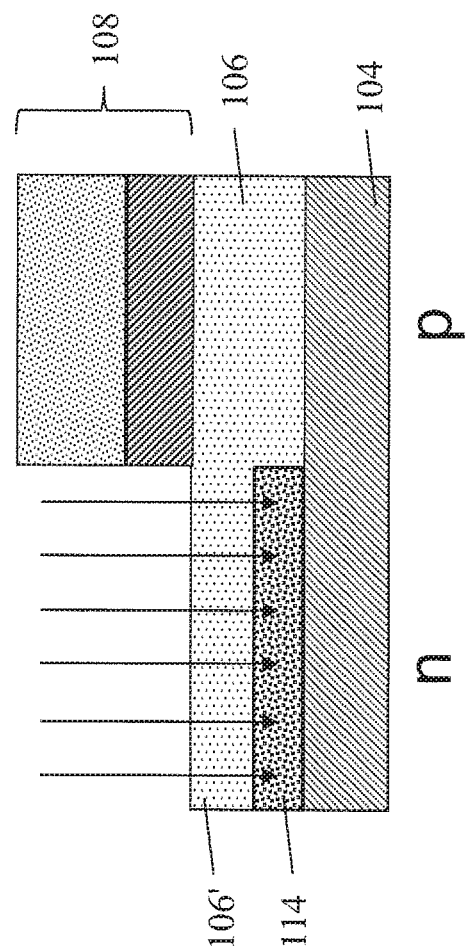

The implanted species represented by the arrows in FIG. 6 may be any appropriate species, such as Si, Ge or other neutral implant that results in a damaged or amorphized lower portion 114. However, it should be noted that the implant energy and other conditions should be selected so as to keep an upper portion of the rSiGe layer 106' in a crystalline state, as this upper portion acts as a seed layer for a subsequent recrystallization of the entire layer. For example, in the case of using Si as the implant species, an implant energy in the range of about 10-30 KeV may be used, with an implant dosage of about $1 \times 10^{14}$ atoms/cm$^2$.

Figure 7:
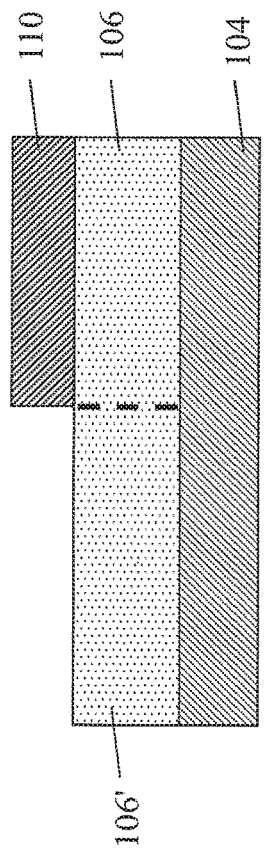

Following the amorphizing implant, the resist layer portion 112 of the block mask 108 is removed prior to a recrystallization anneal that fully crystallizes the relaxed (rSiGe) layer 106' in the "n" region, as shown in FIG. 7. Here, the heavy dashed line is used to distinguish between the rSiGe layer 106' and the compressive (cSiGe) layer 106 in the "p" region. The recrystallization anneal may take place, for example, in an N$_2$ ambient at a temperature ranging from about 400 to 1050° C., and for a duration ranging from seconds to hours.

Figure 8:
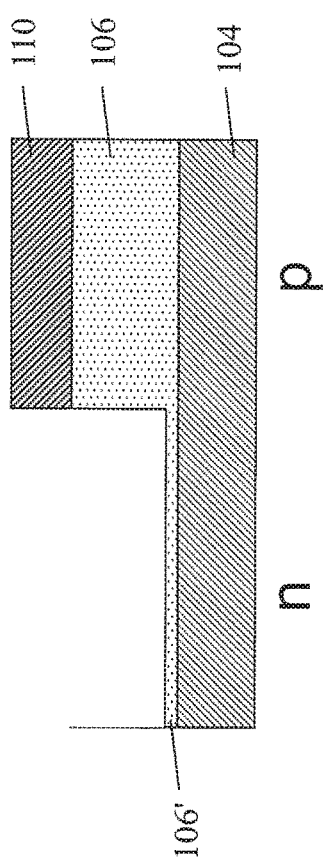
Figure 9:
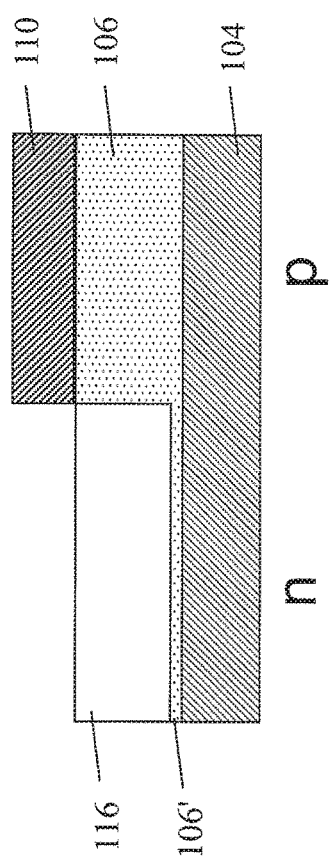

Referring now to FIG. 8, the crystallized rSiGe layer 106' is then recessed in preparation for use as a seed layer for further epitaxial growth. The recessing may be performed by, for example, reactive ion etching (RIE) until the remaining thickness of the rSiGe layer 106' is on the order of about 10 nanometers or less, and more specifically, around 5 nm or less. Following one or more cleaning processes as known in the art (e.g., standard clean (SC1), in situ HCl, etc.), an epitaxial silicon growth process is performed to result in a tensile strained silicon layer 116 in the "n" region, as shown in FIG. 9.

Figure 10:
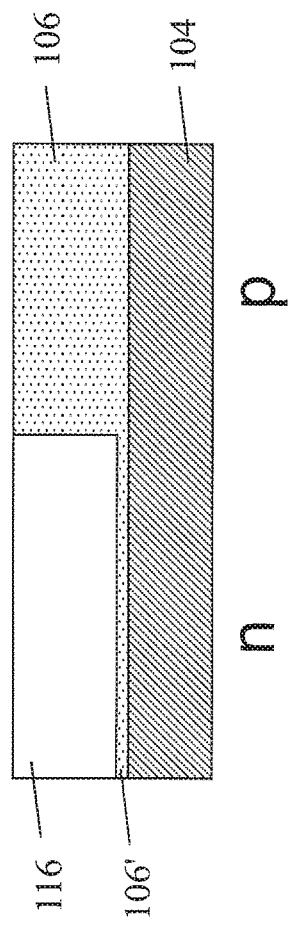
Figure 11:
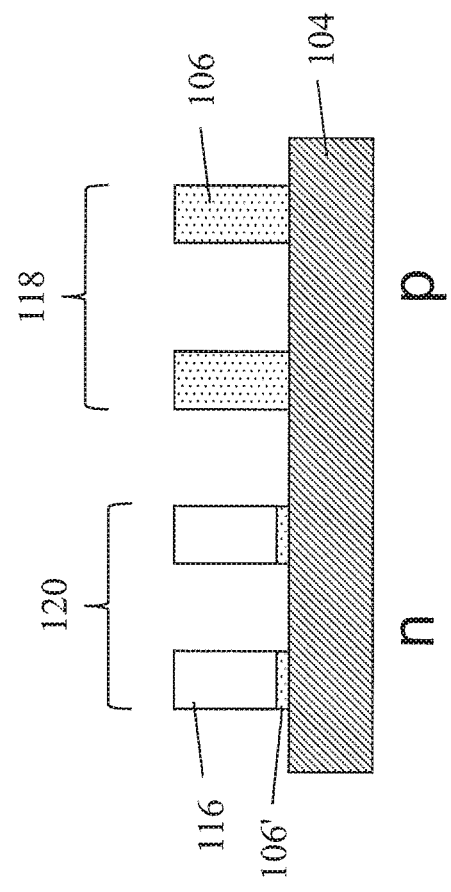

Once the tensile strained silicon layer 116 is formed, the remaining hardmask layer 110 over the "p" region is removed in preparation for fin formation, as shown in FIG. 10. The patterning and formation of the fins is shown in FIG. 11, which illustrates a set of compressive strained SiGe fins 118, and a set of tensile strained Si fins 120. Thereafter, additional processing is performed in accordance with FET device techniques including, for example: dummy gate stack formation in the case of replacement gate FET devices (e.g., gate oxide deposition, amorphous or polysilicon deposition, hardmask deposition, lithography and gate patterning), spacer formation (e.g., silicon nitride, oxide), epitaxial source/drain fin merging, source/drain formation (implantation/anneal), ILD formation, and dummy gate removal. As such processing operations are known to those skilled in the art, the details thereof are omitted herein.

Figure 12:
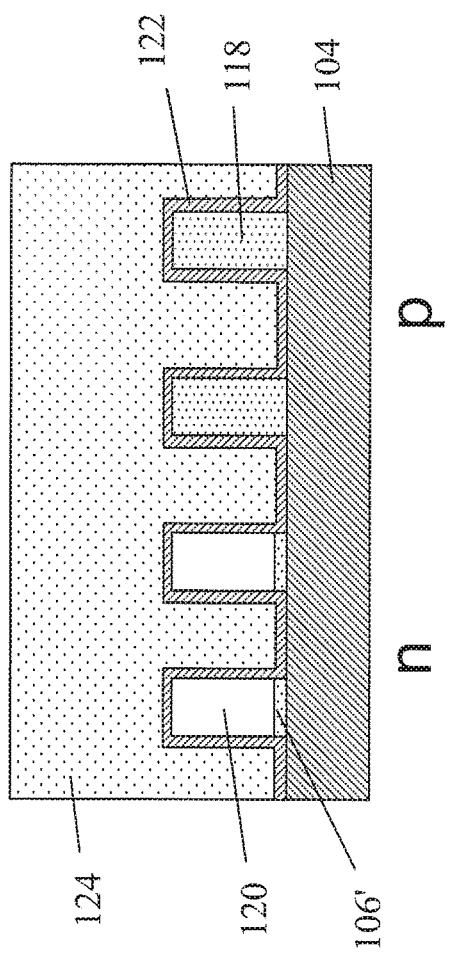

For purposes of continuity and completeness, reference may now be made to the cross sectional view of FIG. 12, which illustrates the patterned fin structures of FIG. 11, following the above described dummy gate stack formation, spacer formation fin merging, and source/drain formation processes prior to dummy gate stack removal. More specifically, FIG. 12 illustrates the formation of a dummy gate stack structure including a dummy gate oxide layer 122 over the BOX layer 104, the compressive strained SiGe fins 118, and the tensile strained Si fins 120, and a dummy amorphous or polysilicon gate layer 124 over the dummy gate oxide layer 122.

Figure 13:
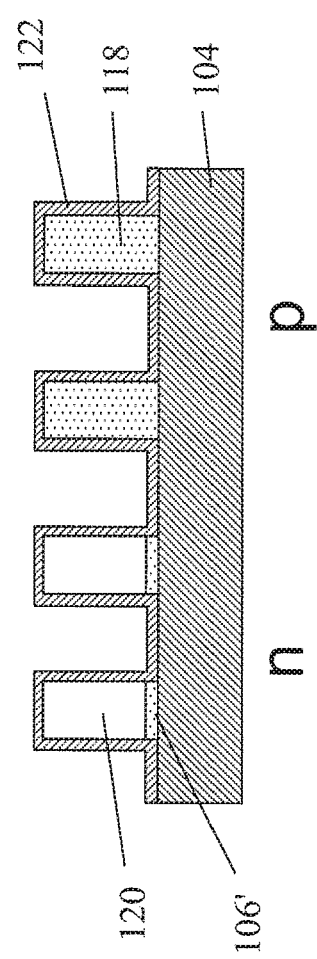
Figure 14:
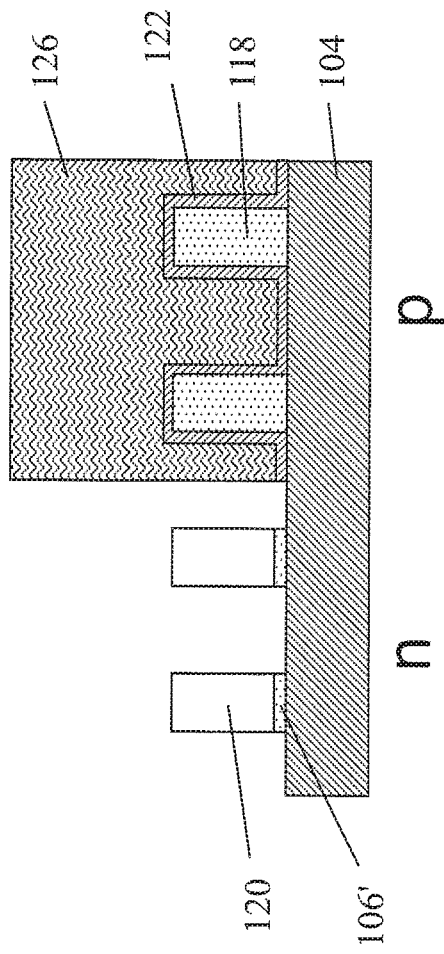

Then, as shown in FIG. 13, the dummy gate layer is removed. In FIG. 14, a patterned mask 126 (e.g., photoresist) is used to block the "p" region and expose a portion of the "n" region in order to remove the dummy gate oxide layer 122 from the exposed portion of "n" region. The etch of the dummy gate oxide layer 122 may be a buffered oxide etch, also known as a buffered HF or BHF, which provides a more controlled etch rate with respect to a more concentrated HF etch.

Figure 15:
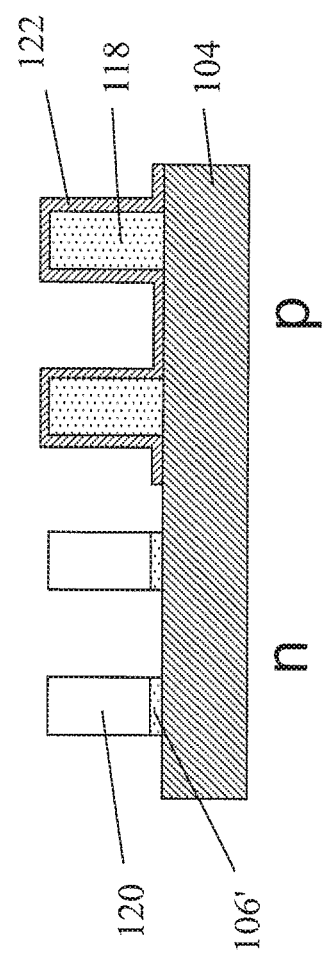
Figure 16:
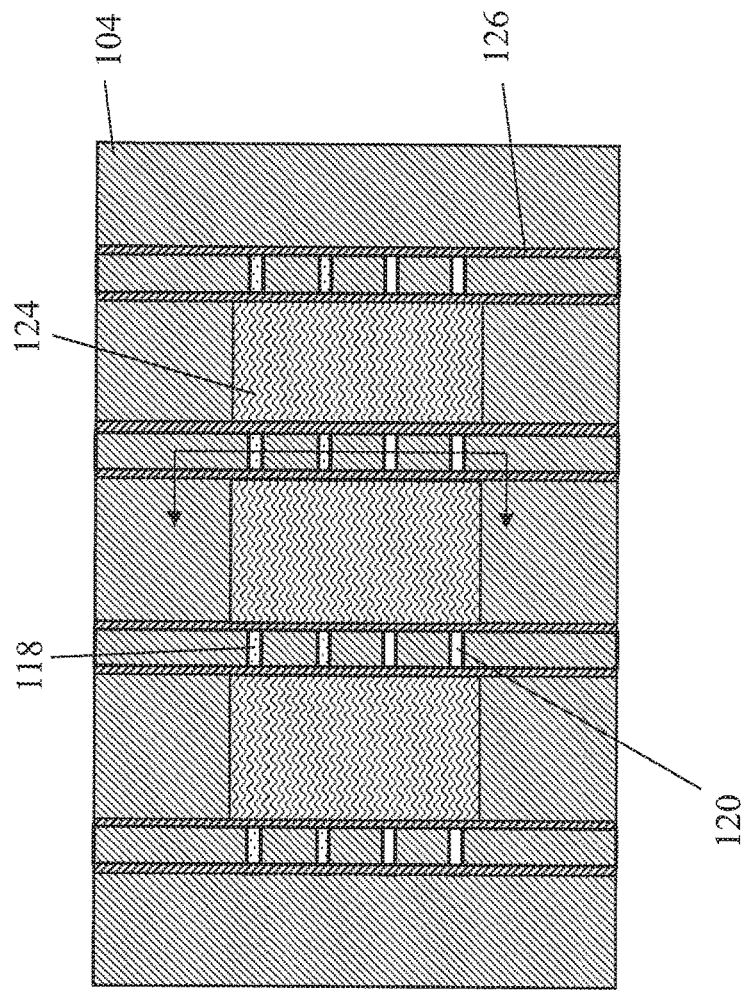
Figure 17:
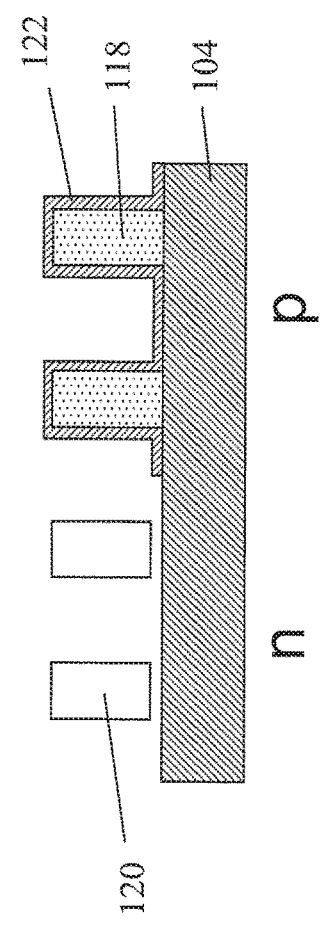

Once the dummy gate oxide layer 122 is removed from the exposed portion of the "n" region, the mask 126 may be removed as shown in FIG. 15, and another etch process is then employed to remove portions of the rSiGe layer 106' beneath the tensile strained Si NFET fins 120. This may be accomplished by an HCl etch, for example. An illustrative top view in this regard is shown in FIG. 16, in addition to the cross sectional view of FIG. 17, taken along the arrows of FIG. 16. In FIG. 16, the top view also illustrates (in addition to the compressive strained SiGe fins 118 and tensile strained Si fins 120), epitaxially merged source/drain regions 124 and dummy gate spacers 126. In FIG. 17, the cross sectional view shows the rSiGe layer 106' having been removed from beneath the tensile strained Si NFET fins 120 in this region corresponding to the gate locations.

Figure 18:
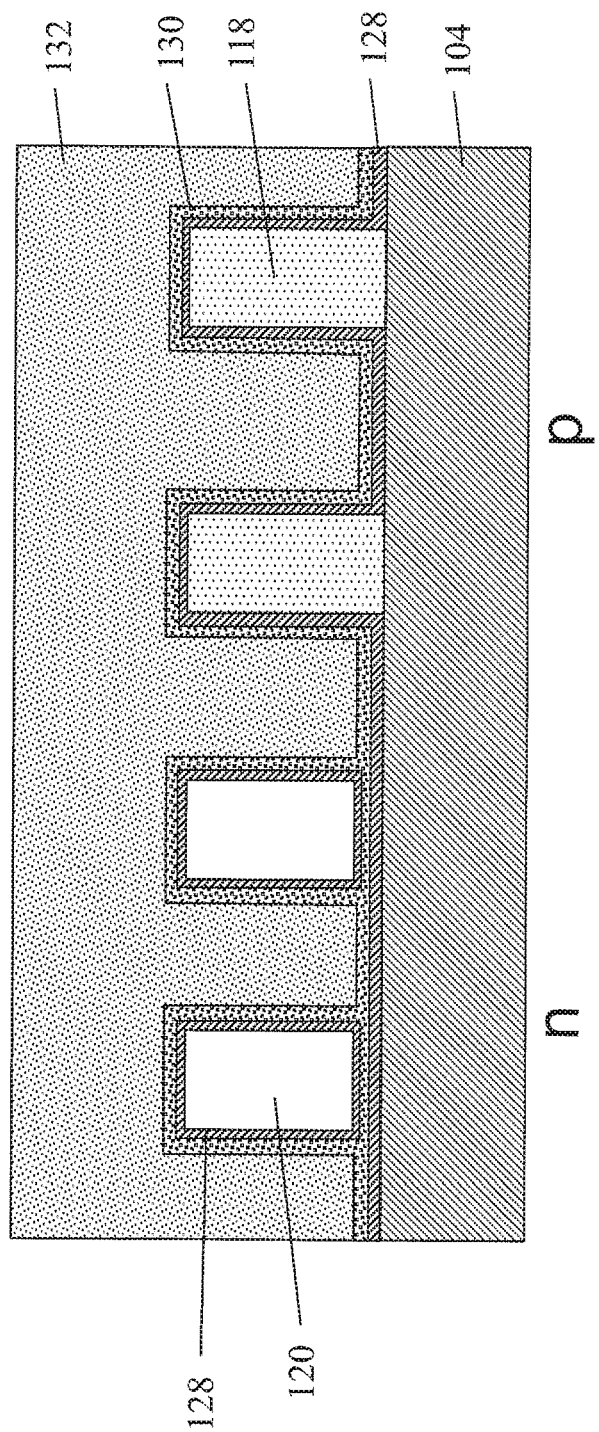

Once the rSiGe layer 106' is removed, the remaining dummy gate oxide layer 122 can be removed from the "p" region in preparation of forming the final high-k and gate stack layers, which is illustrated in FIG. 18. As is shown, a high-k layer 128 is formed over the "n" region and the "p" region. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 118 may be from about 1 nm to about 10 nm, and more specifically from about 1.5 nm to about 3 nm.

It will be noted that the high-k layer 128 may conformally adhere to the underside of the tensile strained Si NFET fins 120. In this instance, the NFET devices may be considered to have a "gate all around" structure (i.e., the gate wraps around top, bottom and side surfaces of the fin structure) while the PFET devices may be considered to have a "tri-gate" structure (i.e., the gate wraps around top and side surfaces of the fin structure). One or more workfunction metal layers 130 are then formed over the structure, followed by one or more gate metal layers 132. The one or more gate metal layers 132 may include, for example, a wetting titanium nitride deposition layer, and one or more of aluminum, titanium-doped aluminum, tungsten or copper.

From this point, conventional processing as known in the art may continue including, for example, chemical mechanical polishing (CMP) of the gate metal layers 132, silicide contact formation for gate, source and drain terminals, upper level wiring formation, etc.

As will thus be appreciated, the embodiments described herein provide for a finFET structure having tensile strained Si channels for NFET devices and a compressive strained SiGe channels for PFET devices using a novel process integration scheme that transforms compressive SiGe to relaxed SiGe by using implantation and recrystallization techniques. This in turn provides the advantages of superior electron mobility for the NFET devices due to tensile strain, and superior hole mobility for the PFET devices by using compressive SiGe channel material.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed:

1. A semiconductor device, comprising:
   a substrate;

a first plurality of P-channel field effect transistor (PFET) devices formed over the substrate, the first plurality of PFET devices comprising compressive strained, silicon germanium (SiGe) fins and a tri-gate structure; and a second plurality of N-channel field effect transistor (NFET) devices formed over the substrate, the second plurality of NFET devices comprising tensile strained, silicon (Si) fins and a gate all around structure.

2. The device of claim 1, wherein the gate all around structure comprises NFET gates that wrap around top, bottom and side surfaces of the second plurality of NFET devices.

3. The device of claim 1, wherein the tri-gate structure comprises PFET gates that wrap around only top and side surfaces of the first plurality of PFET devices.

4. The device of claim 1, wherein the first plurality of PFET devices includes an epitaxially grown silicon germanium material.

5. The device of claim 4, wherein the first plurality of PFET devices partially defines a source region and a drain region.

6. The device of claim 1, wherein the second plurality of NFET devices includes an epitaxially grown semiconductor material.

7. The device of claim 6, wherein the second plurality of NFET devices partially defines a source region and a drain region.

8. A semiconductor device, comprising:
a substrate;
a P-channel field effect transistor (PFET) device formed over the substrate, the PFET device comprising a compressive strained, silicon germanium (SiGe) fin and a tri-gate structure; and
an N-channel field effect transistor (NFET) device formed over the substrate, the NFET device comprising a tensile strained, silicon (Si) fin and a gate all around structure.

9. The device of claim 8, wherein the gate all around structure comprises an NFET gate that wraps around top, bottom and side surfaces of the NFET device.

10. The device of claim 8, wherein the tri-gate structure comprises a PFET gate that wraps around only top and side surfaces of the PFET device.

11. The device of claim 8, wherein the PFET device includes an epitaxially grown silicon germanium material.

12. The device of claim 11, wherein the PFET device partially defines a source region and a drain region.

* * * * *